United States Patent
Rabadam et al.

(10) Patent No.: US 12,165,983 B2
(45) Date of Patent: Dec. 10, 2024

(54) STEPPED ELECTRONIC SUBSTRATE FOR INTEGRATED CIRCUIT PACKAGES

(71) Applicant: Intel Corporation, Santa Clara, CA (US)

(72) Inventors: Eleanor Patricia Paras Rabadam, Folsom, CA (US); Maria Angela Damille Ramiso, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 897 days.

(21) Appl. No.: 16/990,740

(22) Filed: Aug. 11, 2020

(65) Prior Publication Data

US 2022/0051986 A1  Feb. 17, 2022

(51) Int. Cl.
  *H01L 23/538*  (2006.01)
  *H05K 1/02*  (2006.01)
(52) U.S. Cl.
  CPC ...... *H01L 23/5385* (2013.01); *H01L 23/5383* (2013.01); *H01L 23/5386* (2013.01); *H05K 1/0298* (2013.01)
(58) Field of Classification Search
  CPC ..... H01L 23/5385; H01L 23/83; H01L 23/86; H01L 23/49816; H01L 23/13; H05K 1/0298
  See application file for complete search history.

(56) References Cited

U.S. PATENT DOCUMENTS

| | | | | |
|---|---|---|---|---|
| 6,184,463 B1* | 2/2001 | Panchou | ................ | H01L 22/00 |
| | | | | 174/548 |
| 7,470,069 B1* | 12/2008 | Offrein | ................... | G02B 6/43 |
| | | | | 398/139 |
| 2004/0164385 A1* | 8/2004 | Kado | ................. | H01L 23/5386 |
| | | | | 257/E23.079 |
| 2007/0235215 A1* | 10/2007 | Bathan | ................... | H01L 24/97 |
| | | | | 257/E23.101 |
| 2008/0138575 A1* | 6/2008 | Yang | ..................... | H05K 1/147 |
| | | | | 428/137 |
| 2010/0321908 A1* | 12/2010 | Shiota | .................... | H05K 3/323 |
| | | | | 29/832 |
| 2012/0049347 A1* | 3/2012 | Wang | ................. | H01L 25/0657 |
| | | | | 257/737 |
| 2012/0104623 A1* | 5/2012 | Pagaila | ................... | H01L 23/13 |
| | | | | 257/E21.503 |
| 2018/0005947 A1* | 1/2018 | Kasturi | ............... | H01L 23/5385 |

\* cited by examiner

*Primary Examiner* — Evren Seven
*Assistant Examiner* — Sarah L Ell
(74) *Attorney, Agent, or Firm* — Essential Patents Group, LLP

(57) ABSTRACT

An integrated circuit assembly may be formed comprising a stepped electronic substrate having a first surface and an opposing second surface, wherein the first surface comprises a first surface portion or lower step and a second surface portion or upper step. At least one integrated circuit device may be electrically attached to the first surface portion of the first surface of the stepped electronic substrate and an anisotropic conductive layer on the second surface portion of the first surface of stepped electronic substrate. The anisotropic conductive layer may be used to electrically couple the integrated circuit assembly with an additional integrated circuit assembly.

17 Claims, 7 Drawing Sheets

STEPPED ELECTRONIC SUBSTRATE FOR INTEGRATED CIRCUIT PACKAGES

TECHNICAL FIELD

Embodiments of the present description generally relate to the field of integrated circuit package fabrication, and, more specifically, to the fabrication of an integrated circuit package having at least one stepped electronic substrate.

BACKGROUND

The integrated circuit industry is continually striving to produce ever faster, smaller, and thinner integrated circuit packages for use in various electronic products, including, but not limited to, computer servers and portable products, such as portable computers, electronic tablets, cellular phones, digital cameras, and the like.

One way to achieve these goals is by increasing integration density, such as fabricating System-In-Package (SIP) microelectronic packages, multi-device or multi-chip packages (MCPs), integrated device stacking, multi-module integration, and the like. In addition to increasing integration density, there is also a need for increased dimensional reduction (e.g. length (x), width (y), and height (z) dimensions). Reducing the length and width is important in order to reduce the surface area required on a printed circuit board, substrate, or module to which the microelectronic packages are mounted, and reducing the height is important to reduce the overall thickness of the final product.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
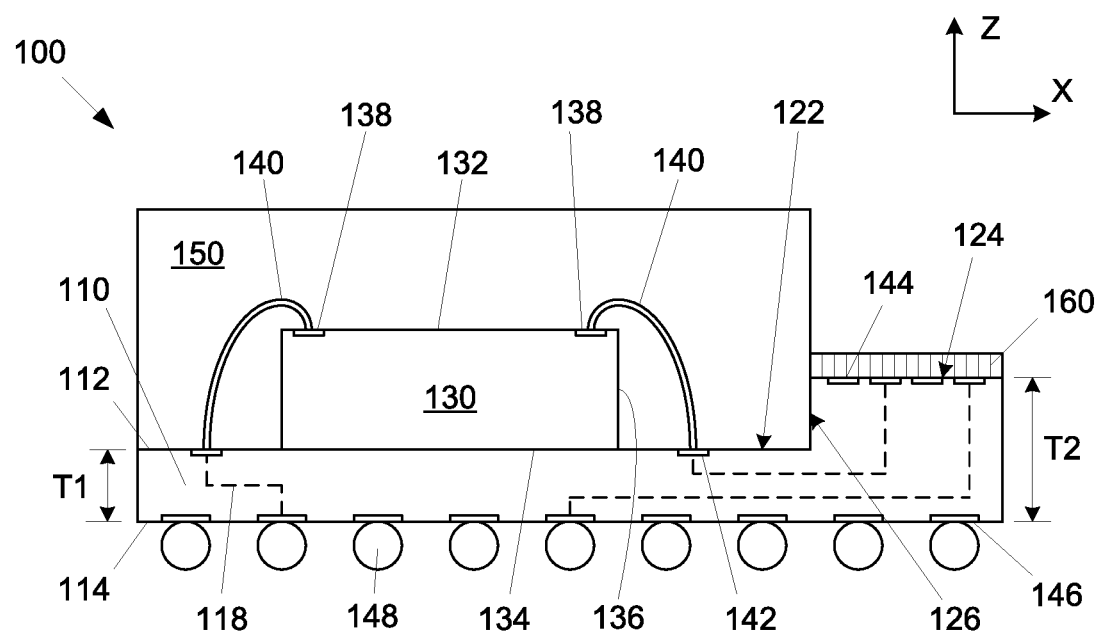
FIG. 1 is a side cross-sectional view of a first integrated circuit assembly, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description include an integrated circuit assembly comprising a stepped electronic substrate having a first surface and an opposing second surface, wherein the first surface comprises a first surface portion or lower step and a second surface portion or upper step. At least one integrated circuit device may be electrically attached to the first surface portion of the first surface of the stepped electronic substrate and an anisotropic conductive layer on the second surface portion of the first surface of the stepped electronic substrate. The anisotropic conductive layer may be used to electrically couple the integrated circuit assembly with an additional integrated circuit assembly.

FIG. 1 illustrates a first integrated circuit assembly or "core" module 100 of the present description, which includes a stepped electronic substrate 110 and at least one integrated circuit device 130 electrically attached to the stepped electronic substrate 110. The stepped electronic substrate 110 may have a first surface 112 and an opposing second surface 114. The first surface 112 may comprise a first surface portion 122, a second surface portion 124, and a third surface portion 126 extending between the first surface portion 122 and the second surface portion 124. In one embodiment of the present description, the first surface portion 122 may be substantially parallel to the second surface portion 124. In a further embodiment of the present description, a thickness T2 between the second surface 114 of the stepped electronic substrate 110 and the second surface portion 124 of the first surface 112 of the stepped electronic substrate 110 may be greater than a thickness T1 between the second surface 114 of the stepped electronic substrate 110 and the first surface portion 122 of the first surface 112 of the stepped electronic substrate 110. In a further embodiment of the present description, the at least one integrated circuit device 130 may be electrically attached to the first surface portion 122 of the first surface 112 of the stepped electronic substrate 110.

The stepped electronic substrate 110 may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra-low-k dielectrics (dielectric constants less than about 3.6), including, but not limited to, carbon doped dielectrics, fluorine doped dielectrics, porous dielectrics, organic polymeric dielectrics, and the like.

The stepped electronic substrate 110 may further include conductive routes 118 or "metallization" (shown in dashed lines) extending through the stepped electronic substrate 110. As will be understood to those skilled in the art, the conductive routes 118 may be a combination of conductive traces (not shown) and conductive vias (not shown) extending through the plurality of dielectric material layers (not shown). These conductive traces and conductive vias are well known in the art and are not shown in FIG. 1 for purposes of clarity and conciseness. The conductive traces and the conductive vias may be made of any appropriate conductive material, including but not limited to, metals, such as copper, silver, nickel, gold, and aluminum, alloys thereof, and the like. As will be understood to those skilled in the art, the stepped electronic substrate 110 may be a cored substrate or a coreless substrate. In one embodiment of the present description, the stepped electronic substrate 110 may comprise a silicon or glass interposer. In another embodiment of the present description, the stepped electronic substrate 110 may include active and/or passive devices.

The integrated circuit device 130 may be any appropriate device, including, but not limited to, a microprocessor, a chipset, a graphics device, a wireless device, a memory device, an application specific integrated circuit, a transceiver device, an input/output device, combinations thereof, stacks thereof, and the like. As shown in FIG. 1, the at least one integrated circuit device 130 may each have a first surface 132, an opposing second surface 134, and at least one side 136 extending between the first surface 132 and the second surface 134. Although the integrated circuit device 130 is merely shown as a schematic block, it is understood that it may comprise any appropriate number of integrated circuit dice or components (either passive or active), and may be in any appropriate configuration (stacks, etc.).

In one embodiment of the present description, as shown in FIG. 1, the integrated circuit device 130 may electrically attached to the first surface portion 122 of the first surface 112 for the stepped electronic interposer 110 with at least one of bond wire 140 extending between bond pads 138 in or on the first surface 132 of the integrated circuit device 130 and the bond pads 142 in or on the first surface portion 122 of the first surface 112 of the stepped electronic interposer 110 to form electrical coupling therebetween. It is understood that the bond pads 138 may be in electrical communication with integrated circuitry (not shown) within the integrated circuit device 130.

In another embodiment of the present description, the integrated circuit device 130 may be attached to the first surface portion 122 of the first surface 112 of the stepped electronic interposer 110 through a plurality of device-to-interposer interconnects (not shown), such as reflowable solder bumps or balls, in a configuration generally known as a flip-chip or controlled collapse chip connection ("C4") configuration. The integrated circuit device 130 may be flipped from the configuration shown in FIG. 1 and the device-to-interposer interconnects (not shown) may extend between the bond pads 138 of the integrated circuit device 130 and the bond pads 142 in or on the first surface portion 122 of the first surface 112 of the stepped electronic interposer 110 to form electrical connections therebetween.

As further shown in FIG. 1, a plurality of external interconnects 148 may be attached to bond pads 146 in or on the second surface 114 of the stepped electronic interposer 110 for the attachment thereof to external components (not shown), such as a motherboard or other such substrate.

In one embodiment of the present description, a mold material 150, such as an epoxy material, may be used to at least partially encase the integrated circuit device 130. The processes and techniques for encasing integrated circuit devices in a mold material are well known in the art and for purposes of clarity and conciseness are not discussed herein.

As further shown in FIG. 1, an anisotropic conductive layer 160, which is electrically conductive in a single direction, may be formed on the second surface portion 124 of the first surface 112 of the stepped electronic substrate 110, such that the anisotropic conductive layer 160 is in electrical contact with electrical connectors, such as bond pads 144 (shown) or pin arrays, on the second surface portion 124 of the stepped electrical substrate 110. In one embodiment of the present description, the anisotropic conductive layer 160 may be an anisotropic conductive film comprising a thermosetting resin and conductive particles dispersed therein, wherein the conductive particles are aligned to conduct electricity in substantially a single direction and wherein the thermosetting resin provide electrical insulation in all other directions. The materials and methods of used of such anisotropic conductive films are well known in the art, and, for the sake of clarity and conciseness, will not be discussed in detail herein. In the embodiment illustrated in FIG. 1, the anisotropic conductive layer 160 is electrically conductive in substantially only the z-direction.

As shown in FIG. 1, in one embodiment of the present description, the conductive routes 118 may electrically couple the bond pads 142 in or on the first surface portion 122 of the first surface 112 of the stepped electronic interposer 110 to the bond pads 146 in or on the second surface 114 of the stepped electronic interposer 110. In another embodiment, the conductive routes 118 may electrically couple the bond pads 142 on the first surface portion 122 of the first surface 112 of the stepped electronic interposer 110 to the bond pads 144 in or on the second surface portion 124 of the first surface 112 of the stepped electronic interposer 110. In still another embodiment, the conductive routes 118 may electrically couple the bond pads 144 in or on the second surface portion 124 of the first surface 112 of the stepped electronic interposer 110 to the bond pads 146 in or on the second surface 114 of the stepped electronic interposer 110.

Figure 2:
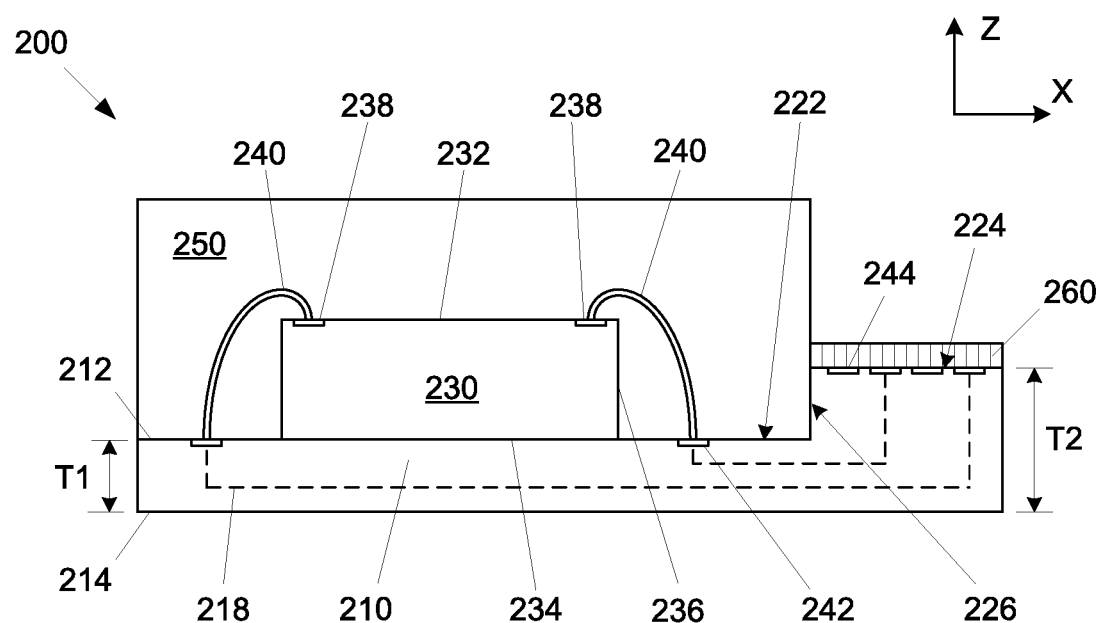
FIG. 2 is a side cross-sectional view of a second integrated circuit assembly, according to an embodiment of the present description.

FIG. 2 illustrates a second integrated circuit assembly or "daughter" module 200 of the present description, which includes a stepped electronic substrate 210 and at least one integrated circuit device 230 electrically attached to the stepped electronic substrate 210. As with the stepped electronic substrate 110 of FIG. 1, the stepped electronic substrate 210 may have a first surface 212 and an opposing second surface 214. The first surface 212 may comprise a first surface portion 222, a second surface portion 224, and a third surface portion 226 extending between the first surface portion 222 and the second surface portion 224. In one embodiment of the present description, the first surface portion 222 may be substantially parallel to the second surface portion 224. In a further embodiment of the present description, a thickness T2 between the second surface 214 of the stepped electronic substrate 210 and the second surface portion 224 of the first surface 212 of the stepped electronic substrate 210 may be greater than a thickness T1 between the second surface 214 of the stepped electronic substrate 210 and the first surface portion 222 of the first surface 212 of the stepped electronic substrate 210. In a further embodiment of the present description, the at least one integrated circuit device 230 may be electrically attached to the first surface portion 222 of the first surface 212 of the stepped electronic substrate 210.

The stepped electronic substrate 210 may comprise the structures and material discussed with regard to the stepped electronic substrate 110 of FIG. 1, and, for the sake of clarity and conciseness, will not be discussed herein.

The integrated circuit device 230 may be any appropriate device, including, but not limited to, a microprocessor, a chipset, a graphics device, a wireless device, a memory device, an application specific integrated circuit, a transceiver device, an input/output device, combinations thereof, stacks thereof, and the like. As shown in FIG. 2, the at least one integrated circuit device 230 may each have a first surface 232, an opposing second surface 234, and at least one side 236 extending between the first surface 232 and the second surface 234. Although the integrated circuit device 230 is merely shown as a schematic block, it is understood that it may comprise any appropriate number of integrated circuit dice and be in any appropriate configuration (stacks, etc.).

In one embodiment of the present description, as shown in FIG. 2, the integrated circuit device 230 may electrically attached to the first surface portion 222 of the first surface 212 for the stepped electronic interposer 210 with at least one of bond wire 240 extending between bond pads 238 in or on the first surface 232 of the integrated circuit device 230 and the bond pads 242 in or on the first surface portion 222 of the first surface 212 of the stepped electronic interposer 210 to form electrical connection therebetween. It is understood that the bond pads 238 may be in electrical communication with integrated circuit (not shown) within the integrated circuit device 230.

In another embodiment of the present description, the integrated circuit device 230 may be attached to the first surface portion 222 of the first surface 212 of the stepped electronic interposer 210 through a plurality of device-to-interposer interconnects (not shown), such as discussed with regard to the first integrated circuit assembly 100 of FIG. 1.

In one embodiment of the present description, a mold material 250, such as an epoxy material, may be used to at least partially encase the integrated circuit device 230. The processes and techniques for encasing integrated circuit devices in a mold material are well known in the art and for purposes of clarity and conciseness are not discussed herein.

As further shown in FIG. 2, an anisotropic conductive layer 260, which is electrically conductive in a single direction, may be formed on the second surface portion 224 of the first surface 212 of the stepped electronic substrate 210, such that the anisotropic conductive layer 260 is in electrical contact with electrical connectors, such as bond pads 244 (shown) or pin arrays, on the second surface portion 224 of the stepped electrical substrate 210. In one embodiment of the present description and as discussed with regard to FIG. 1, the anisotropic conductive layer 260 may be an anisotropic conductive film comprising a thermosetting resin and conductive particles dispersed therein, wherein the conductive particles are aligned to conduct electricity in substantially a single direction and wherein the thermosetting resin provide electrical insulation in all other directions. In the embodiment illustrated in FIG. 2, the anisotropic conductive layer 260 is electrically conductive in substantially only the z-direction.

It is noted that the second integrated circuit assembly 200 illustrated in FIG. 2 differs from the first integrated circuit assembly 100 illustrated in FIG. 1 in that it does not include the plurality of external interconnects 148 and the bond pads 146 in or on the second surface 114 of the stepped electronic interposer 110. However, it is understood that the second integrated circuit assembly 200 may be fabricated to be substantially the same as the first integrated circuit assembly 100.

Figure 3:
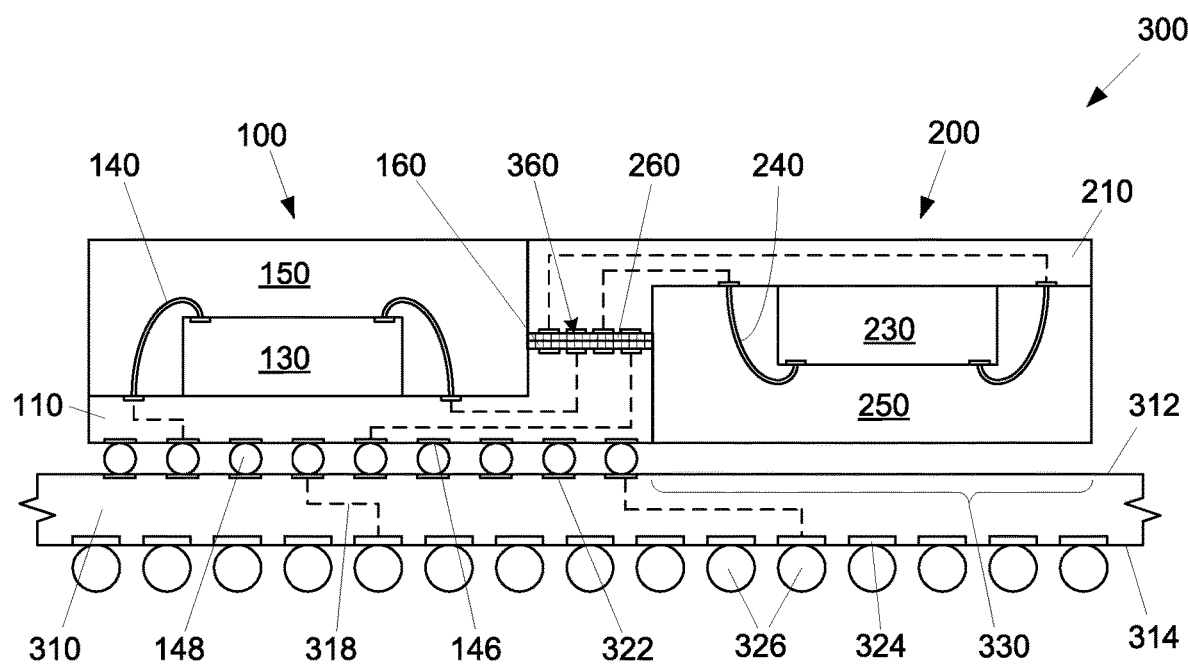
FIG. 3 is a side cross-sectional view of an integrated circuit package comprising the first integrated circuit assembly of FIG. 1 electrically attached to the second integrated circuit assembly of FIG. 2, wherein the integrated circuit package is attached to a carrier substrate, according to one embodiment of the present description.

As shown in FIG. 3, an integrated circuit package 300 may be fabricated by electrically attaching the first integrated circuit assembly 100 of FIG. 1 to the second integrated circuit assembly 200 of FIG. 2 by rotating the second integrated circuit assembly 200 about 180 degrees about the y-direction (not shown) which extends perpendicularly from the plane of FIG. 2 and electrically attached with an anisotropic conductive layer 360. The anisotropic conductuve layer 360 may comprise the anisotropic conductive layer 160 of the first integrated circuit assembly 100 attached to the anisotropic conductive layer 260 of the second integrated circuit assembly 200. It is understood that a single anisotropic conductive layer could be used to electrically attach the first integrated circuit assembly 100 to the second integrated circuit assembly 200.

As further shown in FIG. 3, the first integrated circuit assembly 100 may be electrically attached to a carrier substrate 310. The carrier substrate 310 may have a first surface 312 and an opposing second surface 314. The carrier substrate 310 may comprise a plurality of dielectric material layers (not shown) and may further include conductive routes 318 or "metallization" (shown in dashed lines) extending through the carrier substrate 310, wherein at least one conductive route 318 may extend between at least one bond pad 322 in or on the first surface 312 of the carrier substrate 310 and at least one bond pad 324 in or on the second surface 314 of the carrier substrate 310. The first integrated circuit assembly 100 maybe electrically attached to the carrier substrate 310 with the external interconnects 148 extending between the bond pads 146 and the bond pads 322 in or on the first surface 312 of the carrier substrate 310. As will be understood to those skilled in the art, the carrier substrate 310 may reroute a fine pitch (center-to-center distance between the bond pads) of the bond pads 322 in or on the first surface 312 of the carrier substrate 310 to a relatively wider pitch of the bond pads 324 in or on the second surface 314 of the carrier substrate 310. As further shown in FIG. 3, the plurality of external interconnects 326 may be attached to the bond pads 324 in or on the second surface 314 of the carrier substrate 310 for the attachment thereof to external components (not shown), such as a motherboard or other such substrate.

Referring again to FIG. 3, the embodiments of the present description essentially "floats" the second integrated circuit assembly 200 vertically (z-direction) over the carrier substrate 310, it frees up the area 330 of the carrier substrate 310 under the second integrated circuit assembly 200 for the fabrication of additional conductive routes (not shown), as will be understood to those skilled in the art.

Figure 4:
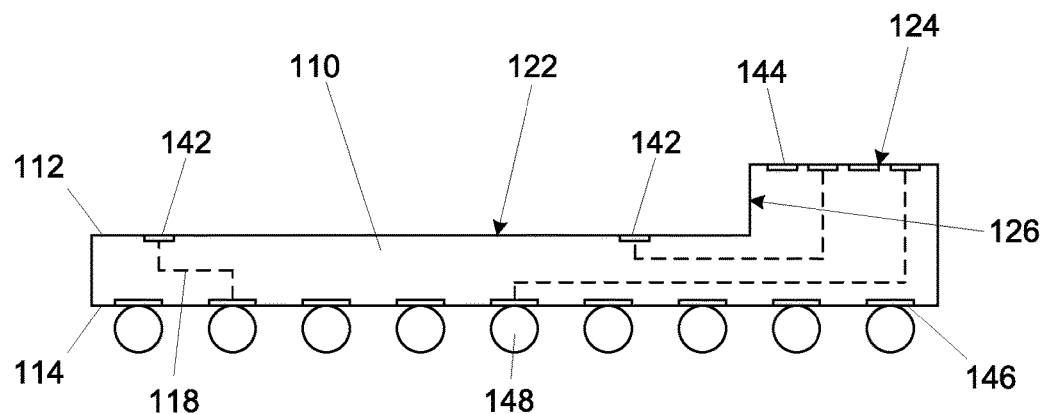
FIGS. 4-7 are side cross-sectional views of the fabrication of an integrated circuit module, according to an embodiment of the present description.
Figure 5:
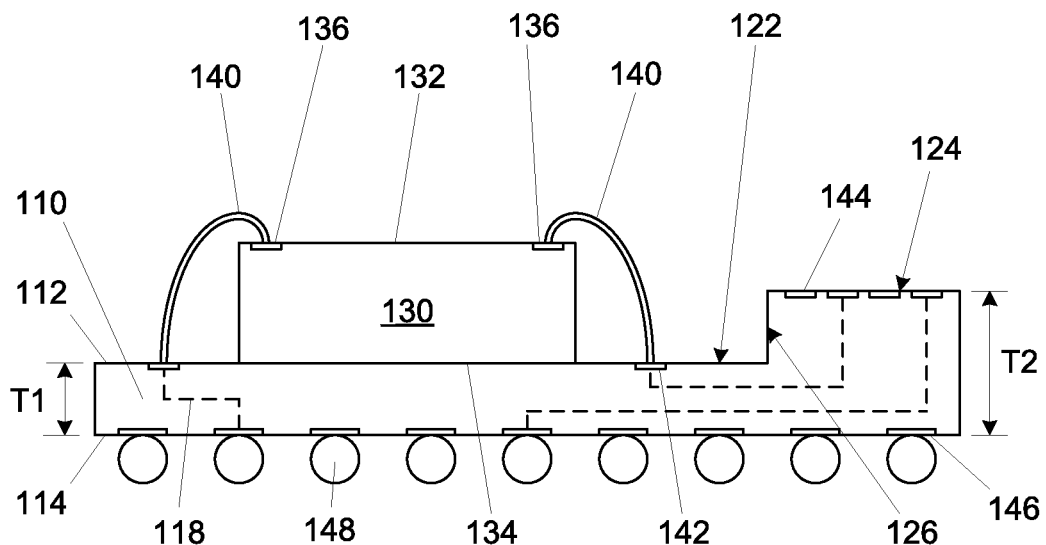
Figure 6:
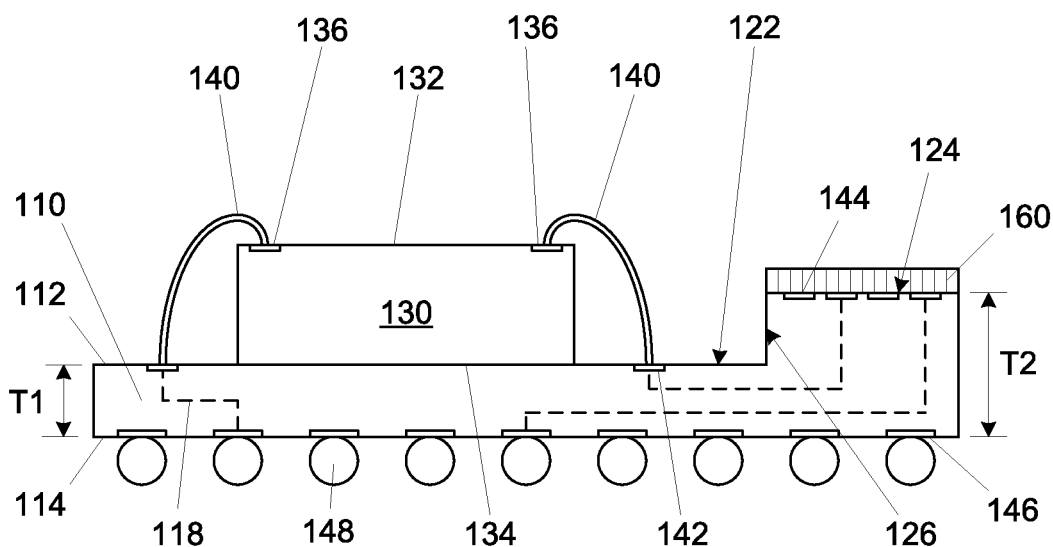
Figure 7:
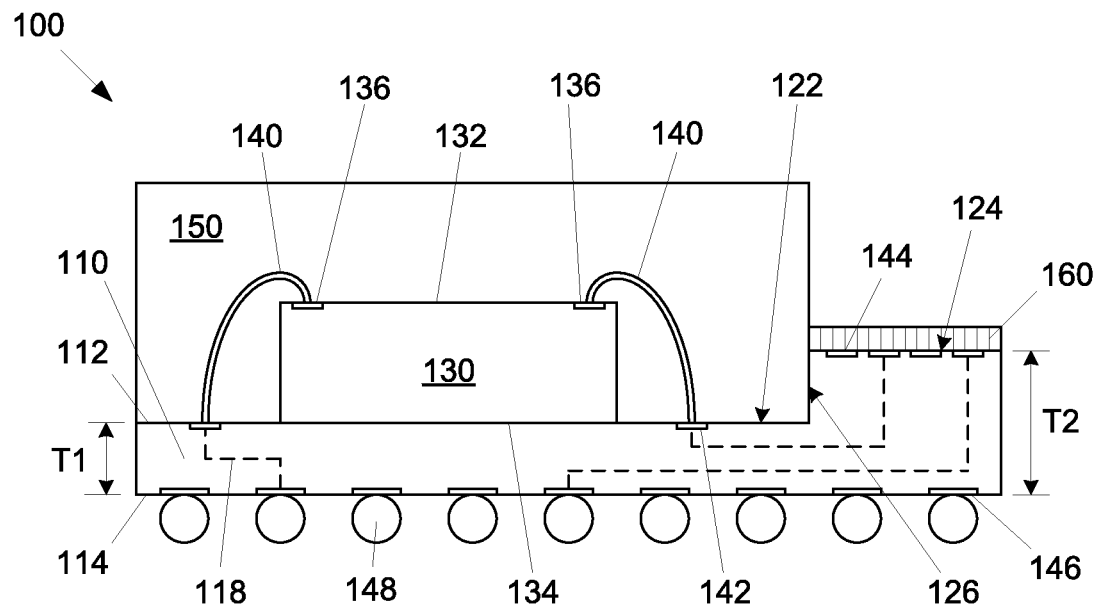

FIGS. 4-7 illustrate a method of fabricating an integrated circuit assembly, such as first integrated circuit assembly 100 of FIG. 1. The components of the integrated circuit assemblies of the present description have been previously discussed and, for the purposes of clarity and conciseness will not be repeated herein. As shown in FIG. 4, the stepped electronic substrate 110 may be provided or fabricated. As shown in FIG. 5, the integrated circuit device 130 may be electrically attached to the first surface portion 122 of the first surface 112 of the stepped electronic substrate 110. As shown in FIG. 6, the anisotropic conductive layer 160 may be formed on the second surface portion 124 of the first surface 112 of the stepped electronic substrate 110. As shown in FIG. 7, the mold material 150 may be formed to at least partially encase the integrated circuit device 130, thereby forming the first integrated circuit assembly 100.

Figure 8:
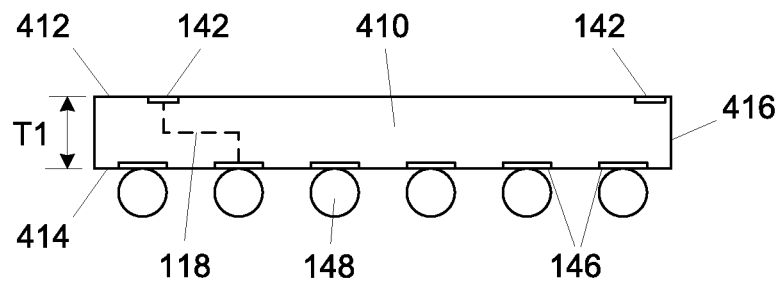
FIGS. 8-13 are side cross-sectional views of the fabrication of an integrated circuit module, according to another embodiment of the present description.

Although the embodiment shown in FIGS. 1-7 illustrate the stepped electronic substrates 110, 210 as being fabricated as a single structure or component, the embodiments of the present description are not so limited. In one embodiment, as shown in FIG. 8-13, a stepped electronic substrate may be formed from multiple structures or components that are attached together. As shown in FIG. 8, a first substrate component 410 may have a first surface 412, an opposing second surface 414, an attachment side 416 extending between the first surface 412 and the second surface 414, and a thickness T1 between the first surface 412 and the second surface 414.

The first substrate component 410 may comprise a plurality of dielectric material layers (not shown) and may further include conductive routes 118 or "metallization" (shown in dashed lines) extending through the first substrate component 410, wherein least one conductive route 118 may extend between at least one bond pad 142 on the first surface 412 and at least one bond 146 on the second surface 414, such as previously discussed. As further shown in FIG. 8, the plurality of external interconnects 148 may be attached to bond pads 146 in or on the second surface 414 of the first substrate component 410 for the attachment thereof to external components (not shown), such as a motherboard or other such substrate.

Figure 9:
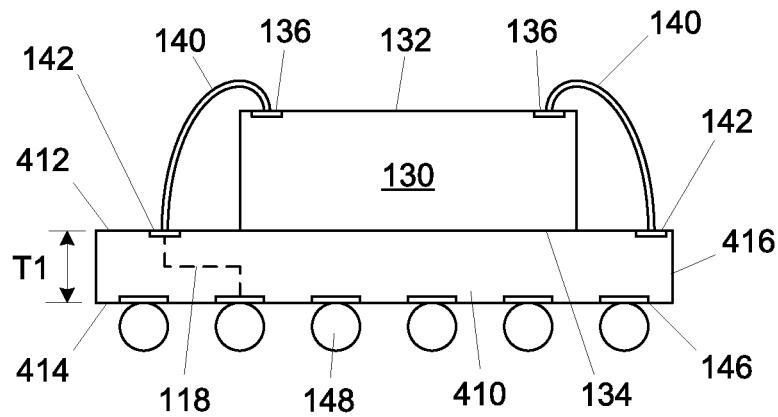

As shown in FIG. 9, the integrated circuit device 130 may be electrically attached to the first surface 412 of the first substrate component 410. In one embodiment of the present description, as shown in FIG. 9, the integrated circuit device 130 may electrically attached with at least one of bond wire 140 extending between the bond pads 138 in or on the first surface 132 of the integrated circuit device 130 and the bond pads 142 on the first surface 412 of the first substrate component 410 to form electrical connection therebetween.

Figure 10:
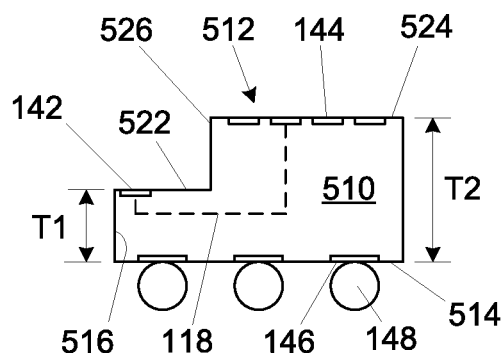

FIG. 10 illustrates a second substrate component 510 of the present description, which may have a first surface 512, an opposing second surface 514, and an attachment side 516 extending between the first surface 512 and the second surface 514. The first surface 512 may comprise a first surface portion 522, a second surface portion 524, and a third surface portion 526 extending between the first surface portion 522 and the second surface portion 524. In one embodiment of the present description, the first surface portion 522 may be substantially parallel to the second surface portion 524. In a further embodiment of the present description, a thickness T2 between the second surface 514 of the second substrate component 510 and the second surface portion 524 of the first surface 512 of the second substrate component 510 may be greater than a thickness T1 between the second surface 514 of the second substrate component 510 and the first surface portion 522 of the first surface 512 of the second substrate component 510. In one embodiment of the present description, the thickness T1 of the first substrate component 410 is substantially the same as the thickness T1 of the second substrate component 510.

The second substrate component 510 may comprise a plurality of dielectric material layers (not shown) and may further include conductive routes 118 or "metallization" (shown in dashed lines) extending through the second substrate component 510, wherein at least one conductive route 118 may extend between at least one bond pad 144 in or on the second portion 524 of the first surface 512 and at least one bond pad 146 in or on the second surface 514, and may extend between at least one bond pad 144 in or on the second portion 524 of the first surface 512 and at least one bond pad 142 in or on the first portion 522 of the first surface 512.

As further shown in FIG. 10, the plurality of external interconnects 148 may be attached to bond pads 146 in or on the second surface 514 of the second substrate component 510 for the attachment thereof to external components (not shown), such as a motherboard or other such substrate.

Figure 11:
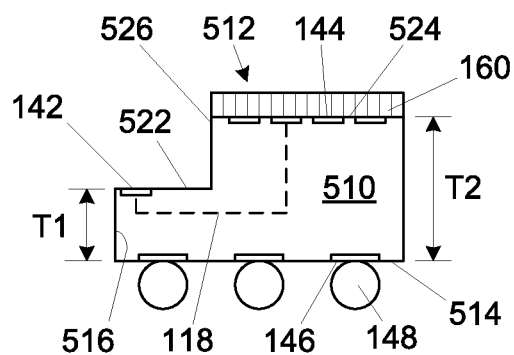

As shown in FIG. 11, an anisotropic conductive layer 160, which is electrically conductive in a single direction, may be formed on the second surface portion 524 of the first surface 512 of the second substrate component 510, such that the anisotropic conductive layer 160 is in electrical contact with electrical connectors, such as bond pads 144 (shown) or pin arrays, on the second surface portion 524 of the second substrate component 510.

Figure 12:
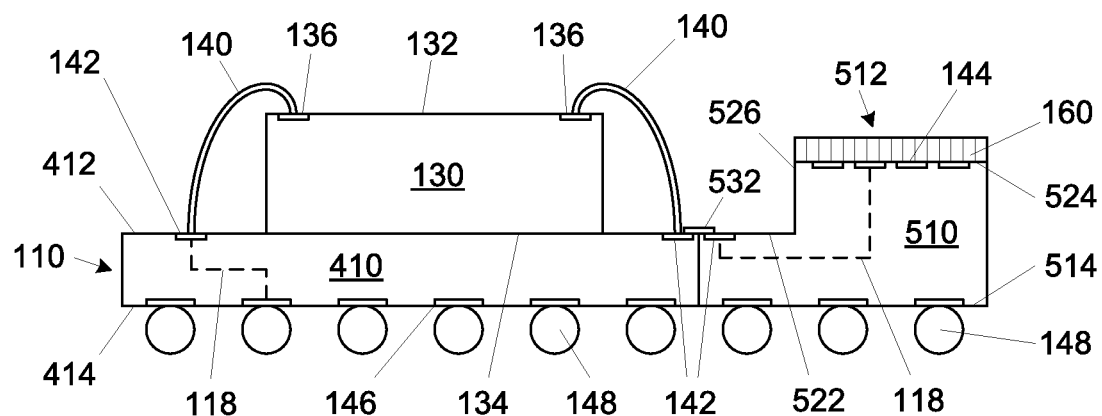

As shown in FIG. 12, the first substrate component 410 and the second substrate component 510 may be attached by adhering the attachment side 416 (see FIG. 8) of the first substrate component 410 and an attachment side 516 (see FIG. 10) of the second substrate component 510 to form the stepped electronic substrate 110. As further shown in FIG. 12, the first substrate component 410 and the second substrate component 510 may be electrically attached by adhering at least one conductive interconnector 532 between a bond pad 142 in or on the first surface 412 of the first substrate component 410 and a bond pad 142 in or on the first surface portion 522 of the first surface 512 of the second substrate component 510.

Figure 13:
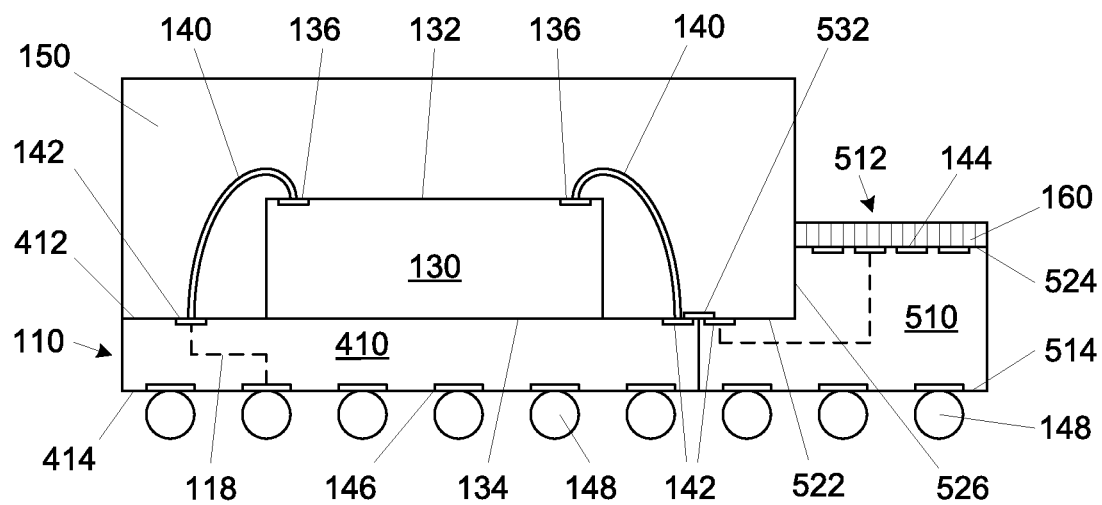

As shown in FIG. 13, the mold material 150 may be used to at least partially encase the integrated circuit device 130. The processes and techniques for encasing integrated circuit device in a mold material are well known in the art and for purposes of clarity and conciseness are not discussed herein.

In one embodiment of the present description, the first surface 412 of the first substrate component 410 may be substantially planar with the first surface portion 522 of the first surface 512 of the second substrate component 510. In a further embodiment of the present description, the second surface 414 of the first substrate component 410 may be substantially planar with the second surface 514 of the second substrate component 510.

Figure 14:
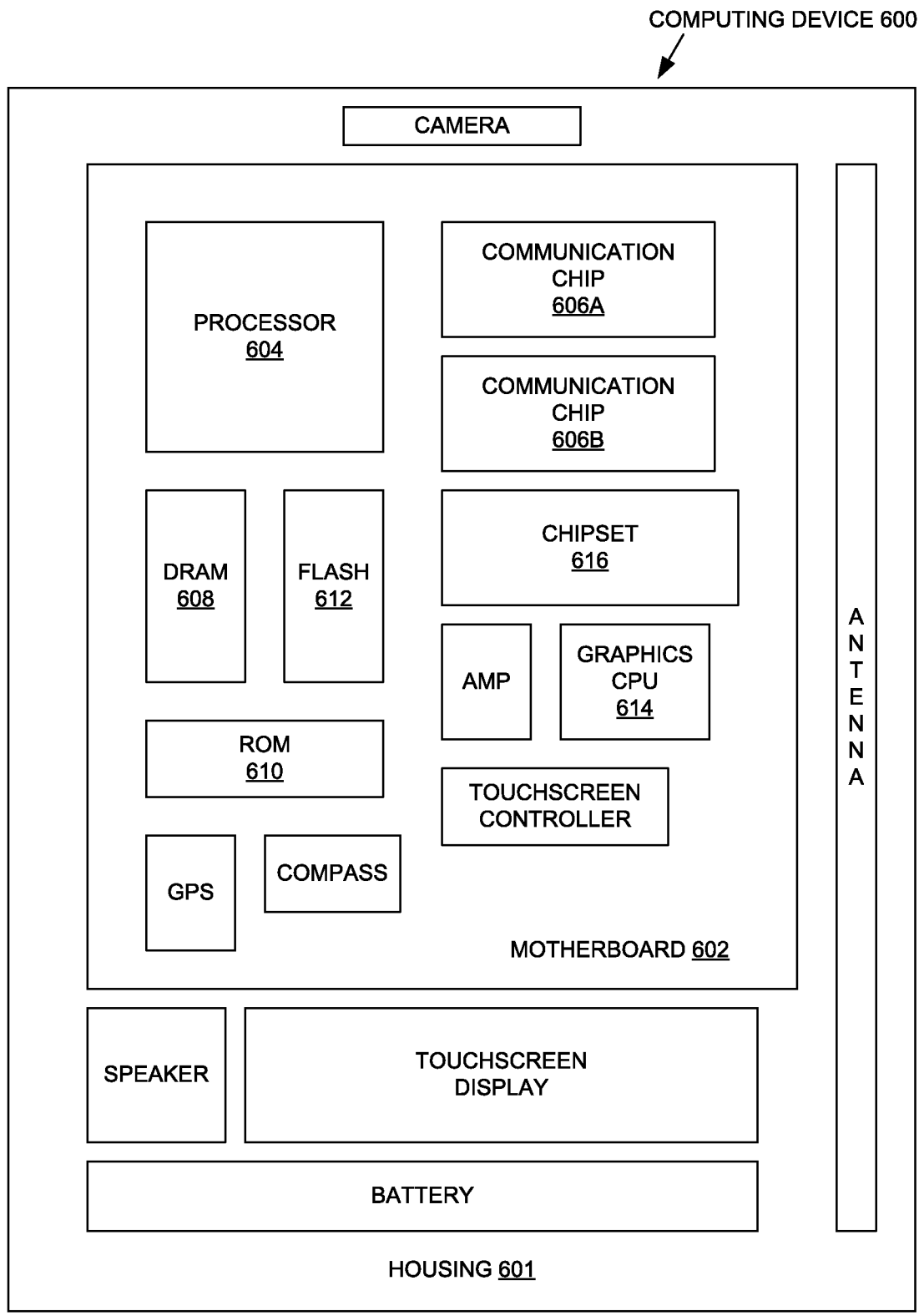
FIG. 14 is an electronic system, according to one embodiment of the present description.

FIG. 14 illustrates an electronic or computing device 600 in accordance with one implementation of the present description. The computing device 600 may include a housing 601 having a board 602 disposed therein. The computing device 600 may include a number of integrated circuit components, including but not limited to a processor 604, at least one communication chip 606A, 606B, volatile memory 608 (e.g., DRAM), non-volatile memory 610 (e.g., ROM), flash memory 612, a graphics processor or CPU 614, a digital signal processor (not shown), a crypto processor (not shown), a chipset 616, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 602. In some implementations, at least one of the integrated circuit components may be a part of the processor 604.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip or device may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit assembly comprising a stepped electronic substrate comprising a first surface and an opposing second surface, wherein the first surface comprises a first surface portion, a second surface portion, and a third surface portion extending between the first surface portion and the second surface portion, wherein the first surface portion is substantially parallel to the second surface portion; and wherein a thickness between the second surface of the stepped electronic substrate and the second surface portion of the first surface of the stepped electronic substrate is greater than a thickness between the second surface of the stepped electronic substrate and the first surface portion of the first surface of the stepped electronic substrate; at least one integrated circuit device electrically attached to the first surface portion of the first surface of the stepped electronic substrate; and an anisotropic conductive layer on the second surface portion of the stepped electronic substrate.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-14. The subject matter may be applied to other integrated circuit devices and assembly applications, as well as any appropriate electronic application, as will be understood to those skilled in the art.

The follow examples pertain to further embodiments and specifics in the examples may be used anywhere in one or more embodiments, wherein Example 1 is an integrated circuit assembly, comprising a stepped electronic substrate comprising a first surface and an opposing second surface, wherein the first surface comprises a first surface portion, a second surface portion, and a third surface portion extending between the first surface portion and the second surface portion, wherein the first surface portion is substantially parallel to the second surface portion; and wherein a thickness between the second surface of the stepped electronic substrate and the second surface portion of the first surface of the stepped electronic substrate is greater than a thickness between the second surface of the stepped electronic substrate and the first surface portion of the first surface of the stepped electronic substrate; at least one integrated circuit device electrically attached to the first surface portion of the first surface of the stepped electronic substrate; and an anisotropic conductive layer on the second surface portion of the first surface of the stepped electronic substrate.

In Example 2, the subject matter of Example 1 can optionally include a mold material on the at least one integrated circuit device.

In Example 3, the subject matter of either Example 1 or 2 can optionally include at least one interconnect electrically attached to the second surface of the stepped electronic substrate.

In Example 4, the subject matter of any of Examples 1 to 3 can optionally include the stepped electronic substrate comprising a first substrate component having a first surface and an opposing second surface and a second substrate component having a first surface and an opposing second surface; wherein the first surface of the second substrate component comprises a first surface portion, a second surface portion, and a third surface portion extending between the first surface portion and the second surface portion; wherein a thickness between the second surface of the second substrate component and the second surface portion of the first surface of the second substrate component is greater than a thickness between the second surface of second substrate component and the first surface portion of the first surface of the second substrate component; wherein the first substrate component is physically and electrically attached to the second substrate component; wherein the first surface portion of the first surface of the stepped electronic substrate comprises the first surface of the first substrate component and the first surface portion of the first surface of the second substrate component; wherein the second surface of the stepped electronic substrate comprises the second surface of the first substrate component and the second surface of the second substrate component; and wherein the second surface portion of the first surface of the stepped electronic substrate comprises the second surface portion of the first surface of the second substrate component.

In Example 5, the subject matter of Example 4 can optionally include the first substrate component being electrically attached to the second substrate component with at least one interconnection trace formed on the first surface of the first substrate component and the first surface portion of the first surface of the second substrate component.

In Example 6, the subject matter of any of Examples 4 to 5 can optionally include a thickness between the first surface of the first substrate component and the second surface of the first substrate component being substantially the same as the thickness between the second surface of second substrate component and the first surface portion of the first surface of the second substrate component.

Example 7 is an integrated package comprising an a first electronic assembly comprising a stepped electronic substrate having a first surface and an opposing second surface, wherein the first surface comprises a first surface portion, a second surface portion, and a third surface portion extending between the first surface portion and the second surface portion, wherein the first surface portion is substantially parallel to the second surface portion; wherein a thickness between the second surface of the stepped electronic substrate and the second surface portion of the first surface of the stepped electronic substrate is greater than a thickness between the second surface of the stepped electronic substrate and the first surface portion of the first surface of the stepped electronic substrate; and at least one integrated circuit device electrically attached to the first surface portion of the first surface of the stepped electronic substrate; a second electronic assembly comprising a stepped electronic substrate having a first surface and an opposing second surface, wherein the first surface comprises a first surface portion, a second surface portion, and a third surface portion extending between the first surface portion and the second surface portion, wherein the first surface portion is substantially parallel to the second surface portion; wherein a thickness between the second surface of the stepped electronic substrate and the second surface portion of the first surface of the stepped electronic substrate is greater than a thickness between the second surface of the stepped electronic substrate and the first surface portion of the first surface of the stepped electronic substrate; and at least one integrated circuit device electrically attached to the first surface portion of the first surface of the stepped electronic substrate; and an anisotropic conductive layer abutting the second surface portion of the first surface of the stepped electronic substrate of the first electronic assembly and abutting the second surface portion of the first surface of the stepped electronic substrate of the second electronic assembly, wherein the anisotropic conductive layer electrically couples the first electronic assembly and the second electronic assembly.

In Example 8, the subject matter of Example 7 can optionally include a mold material on the at least one integrated circuit device of the first electronic assembly and the at least one integrated circuit device of the second electronic assembly.

In Example 9, the subject matter of either Example 7 or 8 can optionally include at least one interconnect electrically attached to the second surface of the stepped electronic substrate.

In Example 10, the subject matter of any of Examples 7 to 9 can optionally include a carrier substrate wherein the at least one interconnect is electrically attached to the carrier substrate.

In Example 11, the subject matter of Example 10 can optionally include the second electronic assembly not physically contacting the carrier substrate.

In Example 12, the subject matter of any of Examples 7 to 11 can optionally include at least one of the stepped electronic substrate of the first electronic assembly and the stepped electronic substrate of the second electronic assembly comprising a first substrate component having a first surface and an opposing second surface and a second substrate component having a first surface and an opposing second surface; wherein the first surface of the second substrate component comprises a first surface portion, a second surface portion, and a third surface portion extending between the first surface portion and the second surface portion; wherein a thickness between the second surface of the second substrate component and the second surface portion of the first surface of the second substrate component is greater than a thickness between the second surface of second substrate component and the first surface portion of the first surface of the second substrate component; wherein the first substrate component is physically and electrically attached to the second substrate component; wherein the first surface portion of the first surface of the stepped electronic substrate comprises the first surface of the first substrate component and the first surface portion of the first surface of the second substrate component; wherein the second surface of the stepped electronic substrate comprises the second surface of the first substrate component and the second surface of the second substrate component; and wherein the second surface portion of the first surface of the stepped electronic substrate comprises the second surface portion of the first surface of the second substrate component.

In Example 13, the subject matter of Example 12 can optionally include the first substrate component being electrically attached to the second substrate component with at least one interconnection trace formed on the first surface of the first substrate component and the first surface portion of the first surface of the second substrate component.

In Example 14, the subject matter of any of Examples 12 to 13 can optionally include a thickness between the first surface of the first substrate component and the second surface of the first substrate component being substantially the same as the thickness between the second surface of second substrate component and the first surface portion of the first surface of the second substrate component.

Example 15 is an electronic system, comprising a board and an integrated circuit package electrically attached to the board, wherein the integrated circuit package comprises a first electronic assembly comprising a stepped electronic substrate having a first surface and an opposing second surface, wherein the first surface comprises a first surface portion, a second surface portion, and a third surface portion extending between the first surface portion and the second surface portion, wherein the first surface portion is substantially parallel to the second surface portion; wherein a thickness between the second surface of the stepped electronic substrate and the second surface portion of the first surface of the stepped electronic substrate is greater than a thickness between the second surface of the stepped electronic substrate and the first surface portion of the first surface of the stepped electronic substrate; and at least one integrated circuit device electrically attached to the first surface portion of the first surface of the stepped electronic substrate; a second electronic assembly comprising a stepped electronic substrate having a first surface and an opposing second surface, wherein the first surface comprises a first surface portion, a second surface portion, and a third surface portion extending between the first surface portion and the second surface portion, wherein the first surface portion is substantially parallel to the second surface portion; wherein a thickness between the second surface of the stepped electronic substrate and the second surface portion of the first surface of the stepped electronic substrate is greater than a thickness between the second surface of the stepped electronic substrate and the first surface portion of the first surface of the stepped electronic substrate; and at least one integrated circuit device electrically attached to the first surface portion of the first surface of the stepped electronic substrate; an anisotropic conductive layer abutting the second surface portion of the first surface of the stepped electronic substrate of the first electronic assembly and abutting the second surface portion of the first surface of the stepped electronic substrate of the second electronic assembly, wherein the anisotropic conductive layer electrically couples the first electronic assembly and the second electronic assembly; and a carrier substrate electrically attached to the second surface of the stepped electronic substrate with at least one interconnect, wherein the carrier substrate is electrically attached to the board.

In Example 16, the subject matter of Example 15 can optionally include a mold material on the at least one integrated circuit device of the first electronic assembly and the at least one integrated circuit device of the second electronic assembly.

In Example 17, the subject matter of Example 15 can optionally include the second electronic assembly not physically contacting the carrier substrate.

In Example 18, the subject matter of any of Examples 15 to 17 can optionally include at least one of the stepped electronic substrate of the first electronic assembly and the stepped electronic substrate of the second electronic assembly comprising a first substrate component having a first surface and an opposing second surface and a second substrate component having a first surface and an opposing second surface; wherein the first surface of the second substrate component comprises a first surface portion, a second surface portion, and a third surface portion extending between the first surface portion and the second surface portion; wherein a thickness between the second surface of the second substrate component and the second surface portion of the first surface of the second substrate component is greater than a thickness between the second surface of second substrate component and the first surface portion of the first surface of the second substrate component; wherein the first substrate component is physically and electrically attached to the second substrate component; wherein the first surface portion of the first surface of the stepped electronic substrate comprises the first surface of the first substrate component and the first surface portion of the first surface of the second substrate component; wherein the second surface of the stepped electronic substrate comprises the second surface of the first substrate component and the second surface of the second substrate component; and wherein the second surface portion of the first surface of the stepped electronic substrate comprises the second surface portion of the first surface of the second substrate component.

In Example 19, the subject matter of Example 18 can optionally include the first substrate component being electrically attached to the second substrate component with at least one interconnection trace formed on the first surface of the first substrate component and the first surface portion of the first surface of the second substrate component.

In Example 20, the subject matter of any of Examples 18 to 19 can optionally include a thickness between the first surface of the first substrate component and the second surface of the first substrate component being substantially the same as the thickness between the second surface of second substrate component and the first surface portion of the first surface of the second substrate component.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An integrated circuit assembly, comprising:
    a first stepped electronic substrate having a first surface and an opposing second surface, wherein:
        the first surface comprises a first surface portion, a second surface portion, and a third surface portion extending between the first surface portion and the second surface portion;
        the first surface portion is substantially parallel to the second surface portion;
        a first thickness between the second surface and the first surface portion is less than a second thickness between the second surface and the second surface portion;
        the first surface portion comprises first bond pads;
        the second surface portion comprises second bond pads;
        the second surface comprises third bond pads;
        a first conductive route couples a first individual one of the second bond pads to an individual one of the first bond pads or third bond pads; and
        a second conductive route couples a second individual one of the second bond pads to an individual one of the first bond pads or third bond pads;
    at least one integrated circuit device electrically attached to the first surface portion through the first bond pads;
    an anisotropic conductive layer on the second surface portion of the first surface of the stepped electronic substrate, the anisotropic conductive layer in contact with the first and second individual ones of the second bond pads; and
    a second stepped electronic substrate having a first surface and an opposing second surface, wherein:
        the first surface of the second stepped electronic substrate comprises a first surface portion, a second surface portion, and a third surface portion extending between the first surface portion and the second surface portion;
        a first thickness between the second surface of the second stepped electronic substrate and the first surface portion of the second stepped electronic substrate is less than a second thickness between the second surface of the second stepped electronic substrate and the second surface portion of the second stepped electronic substrate; and
        the second surface portion of the first stepped electronic substrate is physically and electrically attached to the second surface portion of the second stepped electronic substrate by the anisotropic conductive layer.

2. The integrated circuit assembly of claim 1, further comprising a mold material over the at least one integrated circuit device and in contact with the third surface portion of the first stepped electronic substrate.

3. The integrated circuit assembly of claim 1, further comprising at least one interconnect electrically attached to an individual one of the third bond pads.

4. The integrated circuit assembly of claim 1, wherein the first stepped electronic substrate is electrically coupled to the second stepped electronic substrate with at least one interconnection trace formed on the first surface of the first stepped electronic substrate and the first surface of the second stepped electronic substrate.

5. The integrated circuit assembly of claim 1, wherein the first thickness of the first stepped electronic substrate is substantially the same as the first thickness of the second stepped electronic substrate.

6. An integrated circuit package, comprising:
    a first electronic assembly comprising:
        a first stepped electronic substrate having a first surface and an opposing second surface, wherein:
            the first surface comprises a first surface portion, a second surface portion, and a third surface portion extending between the first surface portion and the second surface portion;
            the first surface portion is substantially parallel to the second surface portion; and a first thickness between the second surface of the first stepped electronic substrate and the first surface portion of the first stepped electronic substrate is less than a second thickness between the second surface of the first stepped electronic substrate and the second surface portion of the first stepped electronic substrate; and the second surface portion comprises first bond pads; and at least one first integrated circuit device electrically attached to the first surface portion of the first stepped electronic substrate;

a second electronic assembly comprising:

a second stepped electronic substrate having a first surface and an opposing second surface, wherein:

the first surface comprises a first surface portion, a second surface portion, and a third surface portion extending between the first surface portion and the second surface portion;

the first surface portion is substantially parallel to the second surface portion; and a first thickness between the second surface of the second stepped electronic substrate and the first surface portion of the first stepped electronic substrate is less than a second thickness between the second surface of the second stepped electronic substrate and the second surface portion of the second stepped electronic substrate; and the second surface portion comprises second bond pads; and at least one second integrated circuit device electrically attached to the first surface portion of the second stepped electronic substrate; and an anisotropic conductive layer abutting the second surface portion of the first stepped electronic substrate and abutting the second surface portion of the second stepped electronic substrate, wherein the anisotropic conductive layer electrically couples the first electronic assembly to the second electronic assembly through the first bond pads and the second bond pads.

7. The integrated circuit package of claim 6, further comprising a mold material on the at least one first integrated circuit device of the first electronic assembly and a mold material on the at least one second integrated circuit device of the second electronic assembly.

8. The integrated circuit package of claim 6, further comprising a plurality of interconnects electrically attached to the second surface of the first stepped electronic substrate, wherein anisotropic conductive layer electrically couples at least one of the interconnects to the second integrated circuit device.

9. The integrated circuit package of claim 8, further comprising a carrier substrate wherein the at least one of the interconnects is electrically attached to the carrier substrate.

10. The integrated circuit package of claim 9, wherein the second electronic assembly does not physically contact the carrier substrate.

11. The integrated circuit package of claim 6, wherein the first stepped electronic substrate is electrically coupled to the second stepped electronic substrate with at least one interconnection trace formed on the first surface of the first stepped electronic substrate and the first surface of the second stepped electronic substrate.

12. The integrated circuit package of claim 6, wherein the first thickness of the first stepped electronic substrate is substantially the same as the first thickness of the second stepped electronic substrate.

13. An electronic system comprising:

a board; and an integrated circuit package electrically attached to the board, wherein the integrated circuit package comprises:

the integrated circuit package of claim 6; and a carrier substrate electrically attached to the second surface of the first stepped electronic substrate with at least one interconnect, wherein the carrier substrate is electrically attached to the board.

14. The electronic system of claim 13, wherein the first electronic assembly further comprises a first mold material on the at least one first integrated circuit device, wherein the second electronic assembly further comprises a second mold material on the at least one second integrated circuit device, and wherein the second mold material is space apart from the carrier substrate.

15. The electronic system of claim 13, wherein the second electronic assembly does not physically contact the carrier substrate.

16. The electronic system of claim 13, wherein the first stepped electronic substrate is electrically coupled to the second stepped electronic substrate with at least one interconnection trace formed on the first surface of the first stepped electronic substrate and the first surface of the second stepped electronic substrate.

17. The electronic system of claim 13, wherein the first thickness of the first stepped electronic substrate is substantially the same as the first thickness of the of the second stepped electronic substrate.

* * * * *